(12) United States Patent
Watanabe et al.

(10) Patent No.: US 11,404,269 B2
(45) Date of Patent: Aug. 2, 2022

(54) SINGLE CRYSTAL SUBSTRATE WITH UNDULATING RIDGES AND SILICON CARBIDE SUBSTRATE

(71) Applicant: Seiko Epson Corporation, Tokyo (JP)

(72) Inventors: Yukimune Watanabe, Hokuto (JP); Noriyasu Kawana, Matsumoto (JP)

(73) Assignee: Seiko Epson Corporation

( * ) Notice: Subject to any disclaimer, the term of this patent is extended or adjusted under 35 U.S.C. 154(b) by 327 days.

(21) Appl. No.: 16/628,840

(22) PCT Filed: Jun. 28, 2018

(86) PCT No.: PCT/JP2018/024608
§ 371 (c)(1),
(2) Date: Jan. 6, 2020

(87) PCT Pub. No.: WO2019/009181
PCT Pub. Date: Jan. 10, 2019

(65) Prior Publication Data
US 2020/0135461 A1    Apr. 30, 2020

(30) Foreign Application Priority Data

Jul. 7, 2017  (JP) .............................. JP2017-133416

(51) Int. Cl.
*H01L 21/02* (2006.01)
*C30B 29/06* (2006.01)
*C30B 29/36* (2006.01)

(52) U.S. Cl.
CPC ........ *H01L 21/02598* (2013.01); *C30B 29/06* (2013.01); *C30B 29/36* (2013.01); *H01L 21/02378* (2013.01); *H01L 21/02529* (2013.01)

(58) Field of Classification Search
CPC ......... C30B 25/02; C30B 25/18; C30B 29/06; C30B 29/36; H01L 21/02598;
(Continued)

(56) References Cited

U.S. PATENT DOCUMENTS 5,065,200 A * 11/1991 Bhat ...................... H01S 5/305
                                                372/46.01
5,248,385 A *  9/1993 Powell ................. H01L 21/465
                                                148/DIG. 148
(Continued)

FOREIGN PATENT DOCUMENTS

JP    H01-170015 A    7/1989
JP    2000-064048 A   2/2000
(Continued)

OTHER PUBLICATIONS

Kentaro Shibahara et al., "Surface Morphology of Cubic SoC(100) Grown on Si(100) by Chemical Vapor Deposition", Journal of Crystal Growth 78, Elsevier Science Publishers B.V., North-Holland, Amsterdam, 1986, pp. 538-544.

*Primary Examiner* — John P. Dulka
(74) *Attorney, Agent, or Firm* — Harness, Dickey & Pierce, P.L.C.

(57) ABSTRACT

A single crystal substrate is provided and is characterized in that the single crystal substrate has a foundation substrate provided with a plurality of first grooves, which include a first crystal face and a second crystal face opposed to the first crystal face in an inner face thereof, and the extending direction of which is a<110> direction, and a plurality of second grooves, the extending direction of which intersects with the first grooves, and in which the first grooves are formed in a displaced manner in a depth direction, and a transverse cross-sectional shape of the second groove is a shape in which straight lines are open at an opening angle (Continued)

less than 180°. Further, it is preferred that an angle formed by the first crystal face and the second crystal face is more than 70.6°.

11 Claims, 9 Drawing Sheets

(58) Field of Classification Search
CPC ......... H01L 21/02378; H01L 21/02529; H01L 21/0243; H01L 21/02433; H01L 21/02447; H01L 21/02494; H01L 21/0262; H01L 21/02381
See application file for complete search history.

(56) References Cited

U.S. PATENT DOCUMENTS

| | | | |
|---|---|---|---|
| 6,475,456 B2* | 11/2002 | Nakano | C30B 25/18 423/328.2 |
| 8,133,321 B2* | 3/2012 | Kawahara | C23C 16/45525 438/689 |
| 8,344,242 B2* | 1/2013 | Fiorenza | H01L 31/043 136/262 |
| 2002/0124793 A1* | 9/2002 | Nakano | C30B 25/18 117/84 |
| 2003/0045102 A1* | 3/2003 | Nagasawa | C30B 25/18 438/689 |
| 2003/0047129 A1* | 3/2003 | Kawahara | C30B 25/18 117/2 |
| 2006/0169987 A1* | 8/2006 | Miura | H01L 21/02433 257/E21.127 |
| 2008/0289570 A1* | 11/2008 | Kawahara | C30B 25/02 117/84 |
| 2011/0089431 A1* | 4/2011 | Yagi | C30B 25/18 117/106 |
| 2015/0108427 A1* | 4/2015 | Brueck | H01L 21/02502 257/14 |
| 2016/0032487 A1* | 2/2016 | Ueta | C30B 23/066 117/84 |
| 2018/0202067 A1* | 7/2018 | Hirao | C30B 19/12 |
| 2018/0251911 A1* | 9/2018 | Kubota | C30B 25/18 |
| 2019/0186041 A1* | 6/2019 | Reznicek | H01L 29/16 |
| 2020/0135461 A1* | 4/2020 | Watanabe | H01L 21/02447 |
| 2021/0391427 A1* | 12/2021 | Yoshida | C30B 29/68 |
| 2022/0005691 A1* | 1/2022 | Yoshida | C30B 25/04 |

FOREIGN PATENT DOCUMENTS

| | | |
|---|---|---|
| JP | 2002-201099 A | 7/2002 |
| JP | 2003-068654 A | 3/2003 |
| JP | 2006-196631 A | 7/2006 |
| JP | 2006-342010 A | 12/2006 |
| WO | WO-2006-132082 A1 | 12/2006 |

* cited by examiner

SINGLE CRYSTAL SUBSTRATE WITH UNDULATING RIDGES AND SILICON CARBIDE SUBSTRATE

This application is a U.S. National Phase application of International Application No. PCT/JP2018/024608, filed on Jun. 28, 2018 and published in Japanese as WO 2019-009181 A1 on Oct. 1, 2019, which is based on, and claims priority from JP Application Serial Number 2017-133416, filed on Jul. 7, 2017. The disclosures of the above applications are incorporated by reference herein in their entirety.

1. TECHNICAL FIELD

The present invention relates to a single crystal substrate and a silicon carbide substrate.

2. RELATED ART

Silicon carbide (SiC) is a wide band gap semiconductor having a band gap (2.36 to 3.23 eV) that is two or more times wider than that of Si, and has attracted attention as a material for a high withstand voltage device.

However, since the crystallization temperature of SiC is high unlike Si, it is difficult to form a single crystal ingot by a pulling-up method from a liquid phase in the same manner as a Si substrate. Therefore, a method in which a single crystal ingot of SiC is formed by a sublimation method has been proposed. However, it is very difficult to form a substrate having a large diameter and few crystal defects by such a sublimation method. On the other hand, among SiC crystals, cubic SiC (3C—SiC) can be formed at a relatively low temperature, and therefore, a method in which cubic SiC is epitaxially grown on a substrate has been proposed.

As one method for producing a SiC substrate using this epitaxial growth, a heteroepitaxial technique in which 3C—SiC is grown on a Si substrate in a gas phase has been studied. For example, Journal of Crystal Growth 78 (1986) 538-544 discloses that by using an offset substrate in which in a Si(100) substrate, a [001] direction is inclined to a [110] direction by about 4°, SiC is epitaxially grown on a surface thereof. By doing this, in a SiC growth layer, a reduction of crystal defects called anti-phase boundary (APB) can be achieved.

Further, JP-A-2006-342010 discloses a single crystal substrate for epitaxially growing a silicon carbide single crystal layer having a plurality of waves extending in one parallel direction and a wave (undulation) undulating in a thickness direction of the substrate. By providing such an "undulation", plane defects propagating due to epitaxial growth are associated with each other and can be vanished.

However, in the single crystal substrate having undulations, it is difficult to highly accurately control the curvature of the undulation. Therefore, the curvature of the undulation becomes non-uniform, and warpage of the substrate or the like occurs. Such deformation of the substrate causes a decrease in quality such as generation of crystal defects in a silicon carbide growth layer.

An object of the invention is to provide a single crystal substrate capable of forming a silicon carbide growth layer with few crystal defects and of high quality, and a silicon carbide substrate having a silicon carbide growth layer of high quality.

SUMMARY

The above object is achieved by the following.

A single crystal substrate is characterized in that the single crystal substrate has a foundation substrate provided with a plurality of first grooves, which include a first crystal face and a second crystal face opposed to the first crystal face in an inner face thereof, and the extending direction of which is a<110> direction, and a plurality of second grooves, the extending direction of which intersects with the first grooves, and in which the first grooves are formed in a displaced manner in a depth direction, and a transverse cross-sectional shape of the second groove is a shape in which straight lines are open at an opening angle less than 180°.

According to this, the shape of the second groove is easily formed with good reproducibility, and therefore, an individual difference in shape among the second grooves is less likely to occur. As a result, the occurrence of deformation such as warpage in the single crystal substrate can be suppressed, or the generation of crystal defects in a silicon carbide growth layer to be grown on the single crystal substrate can be suppressed. Accordingly, a single crystal substrate capable of forming a silicon carbide growth layer with few crystal defects and of high quality is obtained.

In the single crystal substrate, it is preferred that the foundation substrate has a first region including the first grooves and the second grooves, and a second region including a plurality of third grooves, which include a third crystal face and a fourth crystal face opposed to the third crystal face in an inner face thereof, and the extending direction of which is different from that of the first grooves, and a plurality of fourth grooves, the extending direction of which intersects with the third grooves, and in which the third grooves are formed in a displaced manner in a depth direction.

According to this, also crystal defects generated in a silicon carbide growth layer grown on the single crystal substrate are isotropically generated, and therefore, the generation of crystal defects remarkably progressing toward one direction can be suppressed. As a result, even when a film thickness of a silicon carbide growth layer to be grown on the single crystal substrate is thin, a silicon carbide growth layer of high quality can be formed.

In the single crystal substrate, it is preferred that the first region and the second region are included so that the first region and the second region are adjacent to each other and are alternately arranged.

According to this, also the characteristics of a silicon carbide growth layer become isotropic, and therefore, a silicon carbide growth layer capable of forming a semiconductor element having uniform characteristics can be formed even without taking into account the orientation of an element to be formed in the silicon carbide growth layer or the like.

In the single crystal substrate, it is preferred that the first region and the second region each have a square shape.

According to this, the shape of the first region and the second region becomes isotropic, and therefore, the effect that the generation of crystal defects is suppressed and also the characteristics of a silicon carbide growth layer become isotropic becomes more prominent.

In the single crystal substrate, it is preferred that an angle formed by the first crystal face and the second crystal face is more than 70.6°.

According to this, when silicon carbide is epitaxially grown by using the single crystal substrate as a foundation, crystal defects in a silicon carbide crystal can be efficiently vanished or reduced. As a result, a silicon carbide growth layer of high quality is obtained.

In the single crystal substrate, it is preferred that the angle formed by the first crystal face and the second crystal face is 100° or more and 176° or less.

According to this, crystal defects can be more efficiently vanished or reduced.

In the single crystal substrate, it is preferred that the foundation substrate further includes a Si{100} plane as a first planar face provided between the first grooves.

According to this, for example, a seed layer can be stably provided adjacent to the first groove.

It is preferred that the single crystal substrate further includes a silicon carbide foundation film provided on the first planar face.

According to this, when a silicon carbide growth layer is grown on the single crystal substrate, the silicon carbide growth layer can be efficiently and stably grown toward the first groove from the silicon carbide foundation film. As a result, a silicon carbide growth layer of higher quality is obtained.

In the single crystal substrate, it is preferred that the foundation substrate contains silicon, polycrystalline silicon carbide, or diamond.

According to this, a silicon carbide growth layer of higher quality can be formed.

A silicon carbide substrate is characterized by including:
the single crystal substrate; and
a silicon carbide growth layer formed on the single crystal substrate.

According to this, a silicon carbide substrate including a semiconductor layer capable of forming a power device by utilizing a wide band gap of the silicon carbide growth layer and few crystal defects therein is obtained.

DETAILED DESCRIPTION

Hereinafter, a single crystal substrate and a silicon carbide substrate will be described in detail based on preferred embodiments shown in the accompanying drawings.

Silicon Carbide Substrate

First, an embodiment of a silicon carbide substrate will be described.

Figure 1:
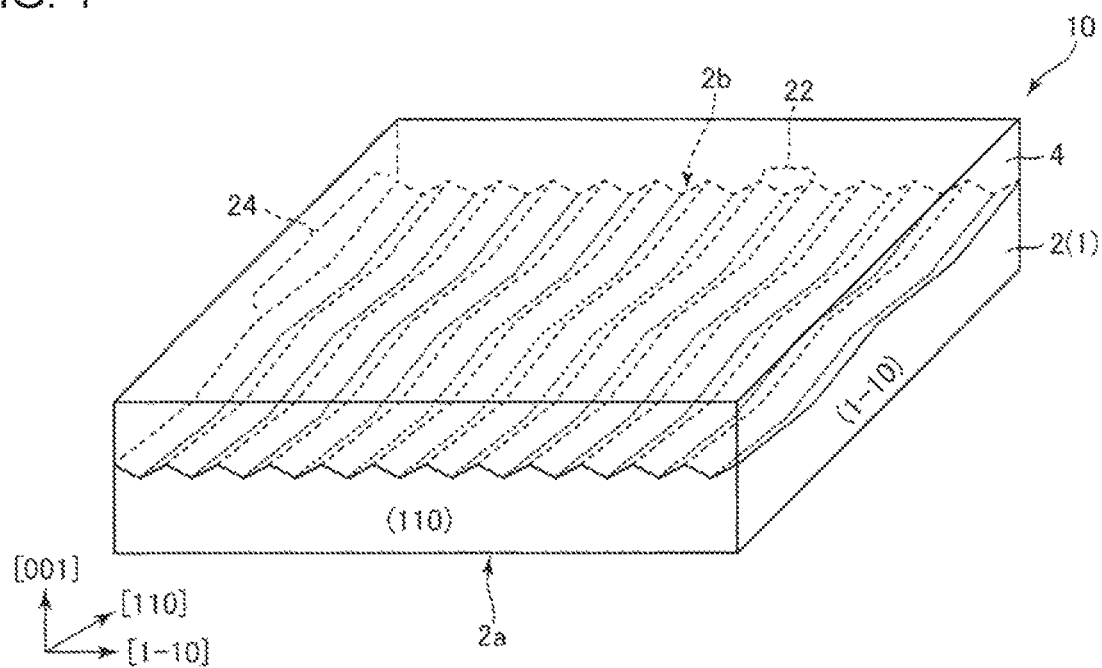
FIG. 1 is a transparent perspective view showing a silicon carbide substrate according to this embodiment.

FIG. 1 is a transparent perspective view showing a silicon carbide substrate according to this embodiment.

A silicon carbide substrate 10 (an embodiment of a silicon carbide substrate of the invention) includes a single crystal substrate 1 (an embodiment of a single crystal substrate of the invention) and a silicon carbide growth layer 4 formed on the single crystal substrate 1. This silicon carbide growth layer 4 is used as a semiconductor layer capable of forming, for example, the below-mentioned power device by utilizing a wide band gap thereof and few crystal defects therein.

As such a silicon carbide growth layer 4, for example, a semiconductor layer constituted by a cubic silicon carbide (3C—SiC) is exemplified. The cubic silicon carbide has a wide band gap of 2.36 eV or more, and also has a high thermal conductivity and a high breakdown electric field, and therefore is particularly preferably used as a wide band gap semiconductor for a power device. Incidentally, the silicon carbide growth layer 4 is not limited to the semiconductor layer constituted by 3C—SiC, and may be a semiconductor layer constituted by 4H—SiC or 6H—SiC.

Then, by using the below-mentioned single crystal substrate 1, the silicon carbide growth layer 4 with few crystal defects and of high quality can be formed.

Incidentally, examples of the power device produced using the silicon carbide substrate 10 include a transistor for a boost converter and a diode. Specific examples thereof include a MOSFET (metal-oxide-semiconductor field-effect transistor), an insulated-gate bipolar transistor (IGBT), and a Schottky barrier diode (SBD).

Hereinafter, the single crystal substrate 1 will be described in more detail.

First Embodiment of Single Crystal Substrate

Figure 2:
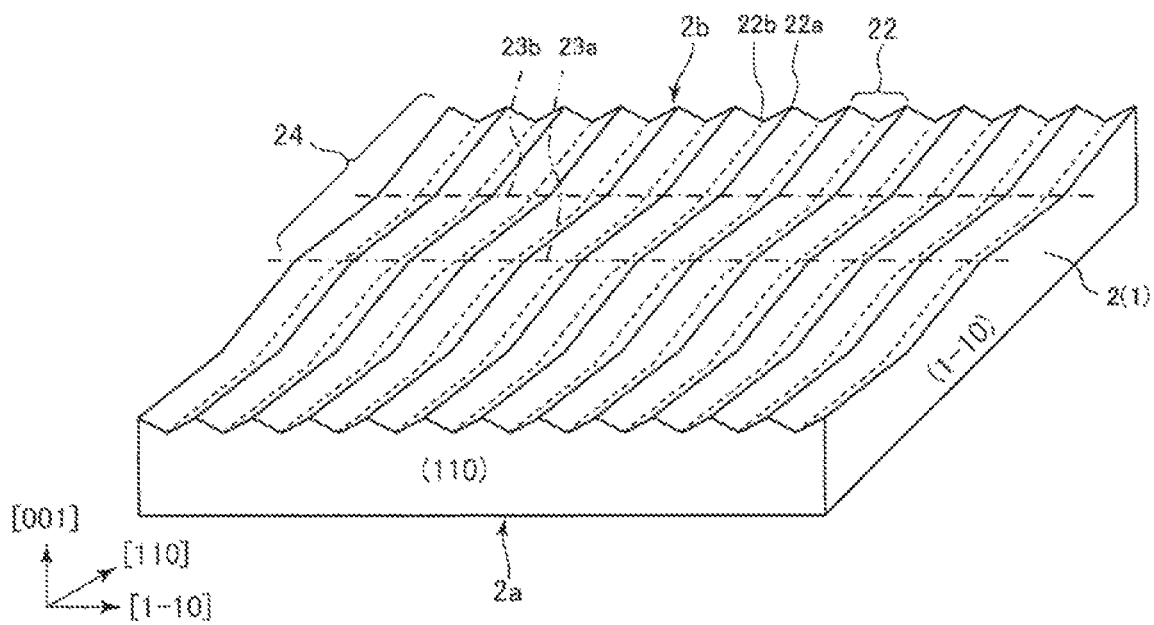
FIG. 2 is a perspective view showing a single crystal substrate according to a first embodiment included in the silicon carbide substrate shown in FIG. 1.
Figure 3:
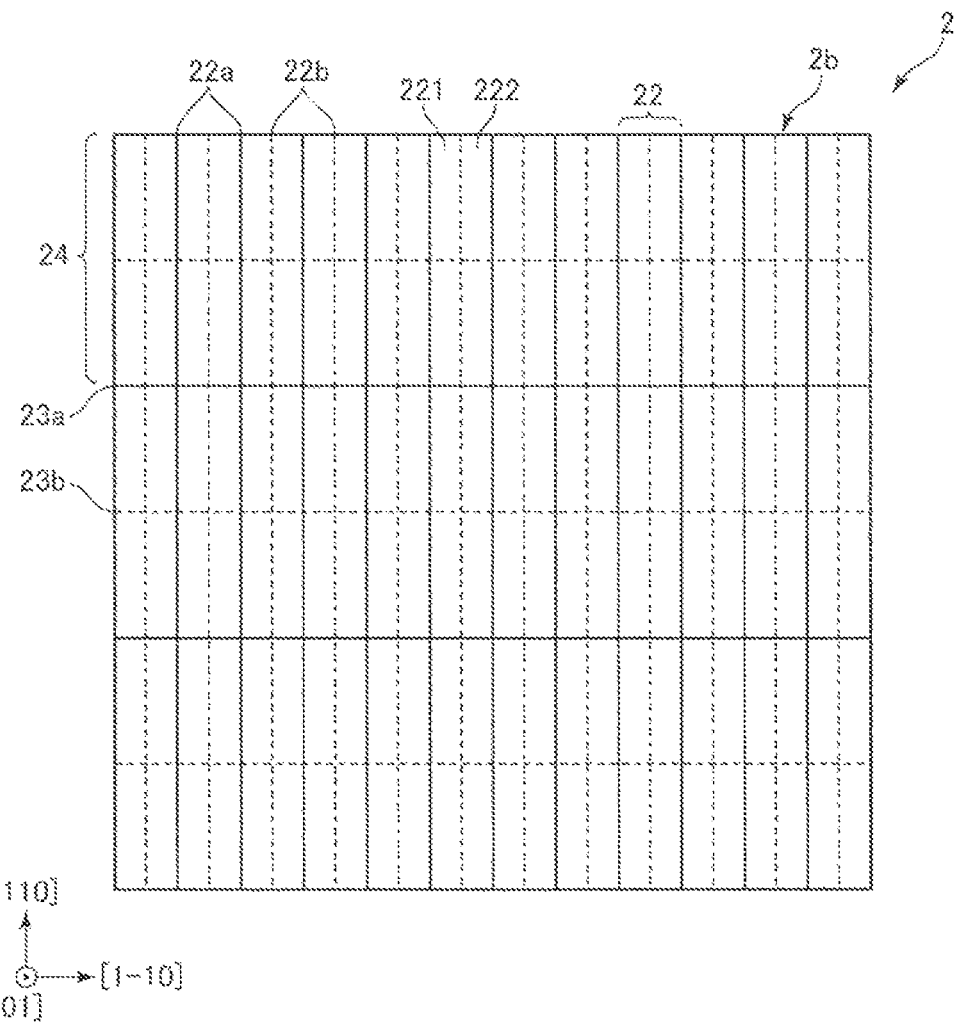
FIG. 3 is a plan view showing an upper face of the single crystal substrate shown in FIG. 2.
Figure 4:
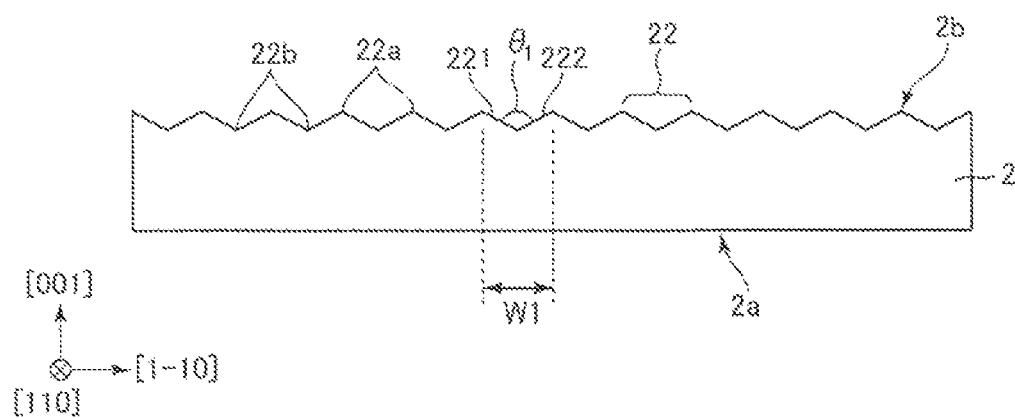
FIG. 4 is a plan view showing a Si(110) plane of the single crystal substrate shown in FIG. 2.
Figure 5:
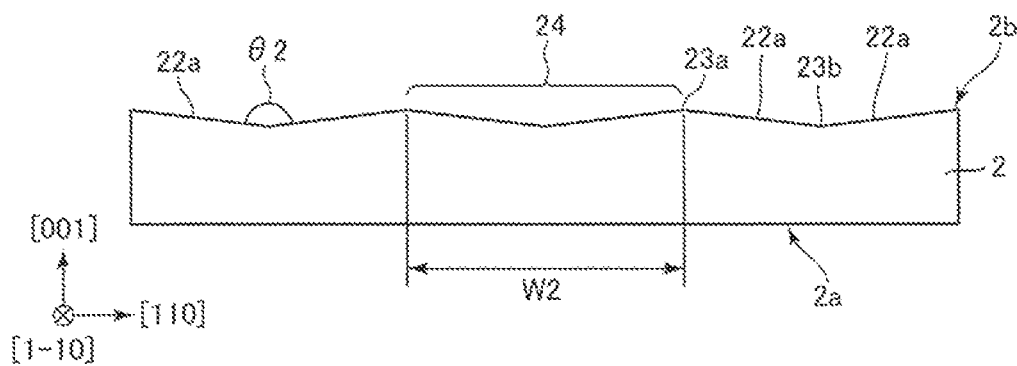
FIG. 5 is a plan view showing a Si(1-10) plane of the single crystal substrate shown in FIG. 2.

FIG. 2 is a perspective view showing the single crystal substrate 1 according to the first embodiment included in the silicon carbide substrate 10 shown in FIG. 1. Further, FIG. 3 is a plan view showing an upper face of the single crystal substrate 1 shown in FIG. 2. Further, FIG. 4 is a plan view showing a Si(110) plane of the single crystal substrate shown in FIG. 2. Further, FIG. 5 is a plan view showing a Si(1-10) plane of the single crystal substrate shown in FIG. 2.

The single crystal substrate 1 according to this embodiment includes a foundation substrate 2. Such a single crystal substrate 1 is used, for example, as a foundation for epitaxially growing the silicon carbide growth layer 4.

The foundation substrate 2 is not particularly limited as long as it is a substrate of a single crystal, but is, for example, a silicon substrate, a polycrystalline silicon carbide substrate, a diamond substrate, a sapphire substrate, a quartz substrate, or a composite substrate in which such a crystal is deposited on an arbitrary substrate.

Among these, the foundation substrate 2 preferably contains silicon, polycrystalline silicon carbide, or diamond, and is more preferably constituted by a crystalline material containing any of these as a main material. Any of these foundation substrates 2 contains a cubic crystal and is favorable as a foundation for growing silicon carbide. Therefore, by using such a foundation substrate 2, the silicon carbide growth layer 4 of higher quality can be formed.

The thickness of the foundation substrate 2 is appropriately set so as to have a mechanical strength to such an extent that it can withstand handling in a step of forming the silicon carbide growth layer 4, but is preferably about 100 µm or more and 2 mm or less as an example.

As the foundation substrate 2 shown in FIG. 1, a single crystal silicon substrate having a Si(001) plane as a principal plane is exemplified as an example. Then, a lower face 2a of the foundation substrate 2 becomes a planar face of the Si(001) plane.

On the other hand, an upper face 2b of the foundation substrate 2 includes a plurality of first grooves 22 formed by recessing the Si(001) plane. Each first groove 22 extends in a [110] direction, and is also aligned in a direction orthogonal to (intersecting with) the [110] direction. According to this, the upper face 2b is covered with the plurality of first grooves 22 arranged in parallel to one another, and becomes a face with a concave-convex shape in which a ridge line 22a located at a boundary between the adjacent first grooves 22 is made to serve as a convex portion (mountain) and a bottom 22b of the first groove 22 is made to serve as a concave portion (valley). Further, in FIGS. 2 and 3, the ridge line 22a is shown with a solid line, and the bottom 22b is shown with a broken line.

Incidentally, the plurality of first grooves 22 are preferably parallel to one another, however, some deviation due to production errors is permitted. Further, a non-parallel portion may be partially included therein or it may be curved or bent in the middle.

Here, the transverse cross-sectional shape of each first groove 22 is a V shape. That is, each first groove 22 includes a first crystal face 221 and a second crystal face 222 opposed to the first crystal face 221 in an inner face thereof. Then, each first groove 22 extends in the [110] direction while maintaining the transverse cross-sectional shape of the V shape constituted by such a first crystal face 221 and a second crystal face 222. Incidentally, the state where the first crystal face 221 and the second crystal face 222 are opposed to each other refers to a state where both are located in an inner face of the first groove 22, and also are located opposite to each other across the bottom 22b of the first groove 22.

Incidentally, an opening angle θ1 (see FIG. 4) of the first groove 22, that is, an angle formed by the first crystal face 221 and the second crystal face 222 is preferably set to more than 70.6°. The first groove 22 having such an opening angle θ1 can efficiently vanish or reduce crystal defects in a silicon carbide crystal when silicon carbide is epitaxially grown by using the single crystal substrate 1 including the first groove 22 in the upper face 2b as the foundation. According to this, the silicon carbide growth layer 4 of high quality is obtained.

Figure 6:
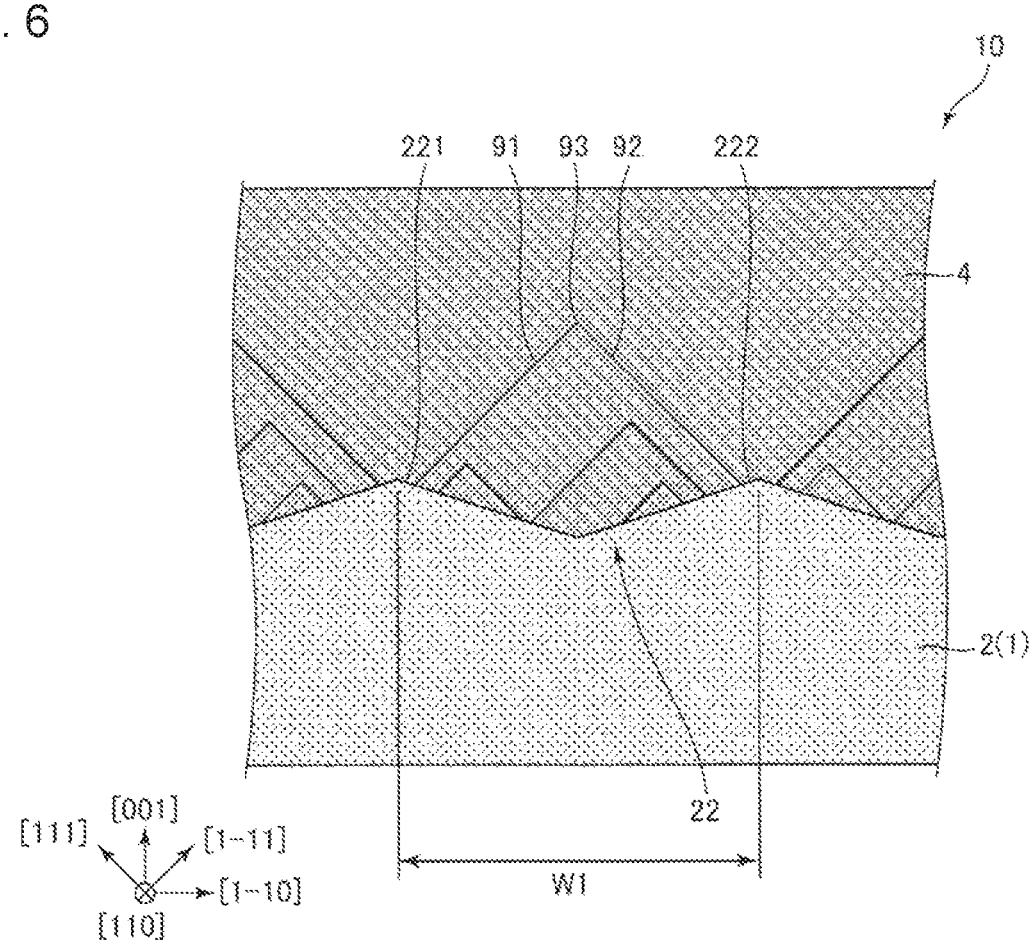
FIG. 6 is a cross-sectional view of the silicon carbide substrate shown in FIG. 1 and is a view schematically showing one example of a crystal defect.

FIG. 6 is a cross-sectional view of the silicon carbide substrate 10 shown in FIG. 1 and is a view schematically showing one example of a crystal defect.

As described above, in the first groove 22, the first crystal face 221 and the second crystal face 222 face each other. In the example shown in FIG. 6, a crystal defect 91 originating from the first crystal face 221 progresses in parallel to a Si(111) plane. On the other hand, a crystal defect 92 originating from the second crystal face 222 progresses in parallel to a Si(1-11) plane. Then, the crystal defect 91 and the crystal defect 92 are associated with each other at an association point 93 and vanished. In such a manner, in the silicon carbide growth layer 4 grown on the single crystal substrate 1 having the first groove 22, the crystal defects 91 and 92 progressing in mutually different directions are associated with each other and can be vanished or reduced.

Incidentally, when the opening angle θ1 of the first groove 22 is less than the above lower limit, the opening angle θ1 is too narrow, and therefore, the probability that the crystal defects 91 and 92 are associated with each other is decreased, and it may not be able to sufficiently reduce the crystal defects 91 and 92.

Further, the opening angle θ1 of the first groove 22 is more preferably 100° or more and 176° or less, further more preferably 150° or more and 175° or less, and particularly preferably 166° or more and 174° or less. According to this, the crystal defects 91 and 92 can be more efficiently vanished or reduced. Incidentally, when the opening angle θ1 of the first groove 22 exceeds the above upper limit, the effect of providing the first groove 22 is diminished, and therefore, the probability that the crystal defects 91 and 92 are associated with each other is decreased, and it may not be able to sufficiently reduce the crystal defects 91 and 92.

The opening angle θ1 of the first groove 22 can be adjusted according to the width of the first groove 22, the forming time of the first groove 22, or the like. For example, by increasing the width of the first groove 22, the opening angle θ1 of the first groove 22 can be made larger, and on the other hand, by decreasing the width of the first groove 22, the opening angle θ1 of the first groove 22 can be made smaller. Further, by increasing the forming time of the first groove 22, the first groove 22 can be made deeper, and therefore, the opening angle θ1 of the first groove 22 can be made smaller, and on the other hand, by decreasing the forming time of the first groove 22, the first groove 22 can be made shallower, and therefore, the opening angle θ1 of the first groove 22 can be made larger.

Further, a width W1 (see FIG. 4) of the first groove 22 is not particularly limited, but is preferably 0.1 µm or more and 100 µm or less, more preferably 0.2 µm or more and 20 µm or less. By setting the width W1 of the first groove 22 within the above range, even when the film thickness of the silicon carbide growth layer 4 to be grown on the single crystal substrate 1 is thin, crystal defects can be more efficiently vanished or reduced.

Incidentally, the transverse cross-sectional shape of the first groove 22 according to this embodiment is a so-called V shape as described above. This refers to a state where, in FIG. 4, the first crystal face 221 and the second crystal face 222 are opposed to each other across the bottom 22b of the first groove 22 so as to open at the opening angle θ1 described above and also the first crystal face 221 and the second crystal face 222 each look like a straight line as viewed from the side face. In the first groove 22 having such a shape, the first crystal face 221 and the second crystal face 222 are each equivalent to being a planar face, and therefore, the shape thereof is easily formed with good reproducibility. That is, an individual difference in shape among the first grooves 22 is less likely to occur. For example, in a case where the transverse cross-sectional shape is a U shape, that is, the first crystal face 221 and the second crystal face 222 are each a curved face, when the shape of the groove is formed, the reproducibility is likely to be low. Therefore, deformation such as warpage is likely to occur in the single crystal substrate 1, or crystal defects may be likely to be generated in the silicon carbide growth layer 4 to be grown on the single crystal substrate 1.

On the other hand, the upper face 2b of the foundation substrate 2 includes, in addition to the above-mentioned plurality of first grooves 22, a plurality of second grooves 24, the extending direction of which is orthogonal to (intersects with) the first grooves 22, and in which the first grooves 22 are formed in a displaced manner in a depth direction. Each second groove 24 extends in a [1-10] direction, and is also aligned in a direction orthogonal to the [1-10] direction. That is, as shown in FIG. 5, by displacing the ridge line 22a of the first groove 22 in the thickness direction of the foundation substrate 2, a polygonal line is formed, and by extending this polygonal line in the [1-10] direction, each second groove 24 is formed. According to this, the upper face 2b is covered with the plurality of second grooves 24 arranged in parallel to one another so as to overlap with the first grooves 22 in plan view, and becomes a face with a concave-convex shape in which a ridge line 23a located at a boundary between the adjacent second grooves 24 is made to serve as a convex portion (mountain) and a bottom 23b of the second groove 24 is made to serve as a concave portion (valley).

Incidentally, the plurality of second grooves 24 are preferably parallel to one another, however, some deviation due to production errors is permitted. Further, a non-parallel portion may be partially included therein or it may be curved or bent in the middle.

In such a manner, the transverse cross-sectional shape of the second groove 24 according to this embodiment is a so-called V shape. This refers to a state where, in FIG. 5, the ridge lines 22a are opposed to each other across the bottom 23b of the second groove 24 so as to open at an opening angle θ2 less than 180° and also each ridge line 22a is a straight line. In other words, the foundation substrate 2 shown in FIG. 5 is provided with the plurality of first grooves 22, which include the first crystal face 221 and the second crystal face 222 opposed to the first crystal face 221 in an inner face thereof, and the extending direction of which is the [110] direction, and the plurality of second grooves 24, the extending direction of which intersects with the first grooves 22, and in which the first grooves 22 are formed in a displaced manner in the depth direction, and the transverse cross-sectional shape of the second groove 24 is a shape in which the straight lines are open at the opening angle θ2 less than 180°. In the second grooves 24 having such a shape, each ridge line 22a is a straight line, and therefore, the shape thereof is easily formed with good reproducibility. That is, an individual difference in shape among the second grooves 24 is less likely to occur. For example, in a case where the transverse cross-sectional shape is a U shape, that is, each ridge line 22a is a curved line, when the shape of the groove is formed, the reproducibility is likely to be low. On the other hand, when the transverse cross-sectional shape is a V shape, such a problem can be solved. Therefore, the occurrence of deformation such as warpage in the single crystal substrate 1 can be suppressed, or the generation of crystal defects in the silicon carbide growth layer 4 to be grown on the single crystal substrate 1 can be suppressed.

Further, since the transverse cross-sectional shape of the second groove 24 is a so-called V shape, crystal defects originating from both sides across the bottom 23b of the second groove 24 are associated with each other and can be vanished or reduced.

Further, by providing the second grooves 24 in addition to the first grooves 22, crystal defects progressing in a direction that cannot be reduced by the above-mentioned first grooves 22 are associated with each other and can be vanished or reduced. Therefore, in the single crystal substrate 1, crystal defects can be efficiently reduced, and even when the film thickness of the silicon carbide growth layer 4 to be grown on the single crystal substrate 1 is thin, the silicon carbide growth layer 4 of high quality can be formed.

Further, the opening angle θ2 (see FIG. 5) of the second groove 24, that is, the angle of the polygonal line formed due to displacement of the ridge line 22a is set to an angle larger than the opening angle θ1 of the first groove 22, and is set to preferably 150° or more, more preferably 160° or more and 178° or less, further more preferably 166° or more and 174° or less. The second groove 24 having such an opening angle θ2 can efficiently vanish or reduce crystal defects in a silicon carbide crystal when silicon carbide is epitaxially grown by using the single crystal substrate 1 including the second groove 24 in the upper face 2b as the foundation. According to this, the silicon carbide growth layer 4 of high quality is obtained.

Incidentally, when the opening angle θ2 of the second groove 24 is less than the above lower limit, the opening angle θ2 is too narrow, and therefore, the probability that crystal defects are associated with each other is decreased, and it may not be able to sufficiently reduce crystal defects. On the other hand, when the opening angle θ2 of the second groove 24 exceeds the above upper limit, the effect of providing the second groove 24 is diminished, and therefore, the probability that crystal defects are associated with each other is decreased, and it may not be able to sufficiently reduce crystal defects.

The opening angle θ2 of the second groove 24 can be adjusted according to the width of the second groove 24, the forming time of the second groove 24, or the like. For example, by increasing the width of the second groove 24, the opening angle θ2 of the second groove 24 can be made larger, and on the other hand, by decreasing the width of the second groove 24, the opening angle θ2 of the second groove 24 can be made smaller. Further, by increasing the forming time of the second groove 24, the second groove 24 can be made deeper, and therefore, the opening angle θ2 of the second groove 24 can be made smaller, and on the other hand, by decreasing the forming time of the second groove 24, the second groove 24 can be made shallower, and therefore, the opening angle θ2 of the second groove 24 can be made larger.

Further, a width W2 (see FIG. 5) of the second groove 24 is not particularly limited, but is preferably 2 times or more and 1000 times or less, more preferably 4 times or more and 800 times or less the width W1 of the first groove 22. By setting the width W2 of the second groove 24 within the above range, even when the film thickness of the silicon carbide growth layer 4 to be grown on the single crystal substrate 1 is thin, crystal defects can be more efficiently vanished or reduced.

Incidentally, the state where the extending direction of the second groove 24 is orthogonal to the extending direction of the first groove 22 refers to a state where an angle formed by the extending directions is within a range of 85° or more and 95° or less.

Further, when a single crystal constituting the foundation substrate 2 is a cubic crystal, for example, a (100) plane, a (010) plane, a (001) plane, a (-100) plane, a (0-10) plane, a (00-1) plane, and the like are mutually equivalent planes. Therefore, the Si(001) plane in the description of this application can be replaced with any of these equivalent planes. That is, the Si(001) plane in the description of this application is not limited only to the plane, and therefore, when these equivalent planes are collectively described, these are representatively described as Si{100} plane. Incidentally, in the description of this application, it is described that there is a predetermined relationship between the Si(001) plane and the other planes or directions, however, when the Si(001) plane is replaced with a plane equivalent thereto, the other planes or directions are also replaced so as to maintain the predetermined relationship.

Similarly, for example, a (111) plane, a (−111) plane, a (1-11) plane, a (11-1) plane, a (−1-11) plane, a (−11-1) plane, and the like are mutually equivalent planes. Therefore, the Si(111) plane or the Si(1-11) plane in the description of this application can be replaced with any of these equivalent planes, and therefore, in this application, when these equivalent planes are collectively described, these are representatively described as Si{111} plane. Incidentally, in the description of this application, it is described that there is a predetermined relationship between the Si(111) plane or the Si(1-11) plane and the other planes or directions, however, when the Si(111) plane or the Si(1-11) plane is replaced with a plane equivalent thereto, the other planes or directions are also replaced so as to maintain the predetermined relationship.

Similarly, for example, a [110] direction, a [101] direction, a [011] direction, a [1-10] direction, a [10-1] direction, a [01-1] direction, and the like are mutually equivalent directions. Therefore, the [110] direction or the [1-10] direction in the description of this application can be replaced with any of these equivalent directions, and therefore, in this application, when these equivalent directions are collectively described, these are representatively described as <110> direction. Incidentally, in the description of this application, it is described that there is a predetermined relationship between the [110] direction or the [1-10] direction and the other planes or directions, however, when the [110] direction or the [1-10] direction is replaced with a direction equivalent thereto, the other planes or directions are also replaced so as to maintain the predetermined relationship.

Second Embodiment of Single Crystal Substrate

Next, the single crystal substrate 1 according to a second embodiment will be described.

Figure 7:
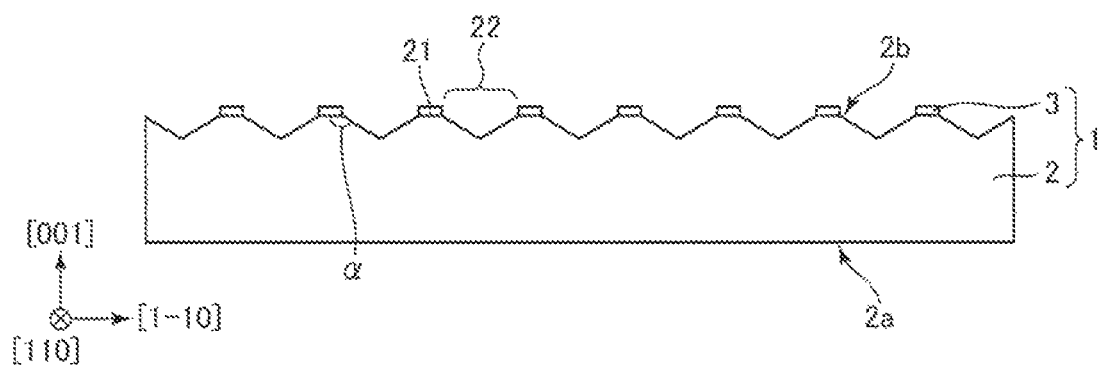
FIG. 7 is a plan view showing a Si(110) plane of a single crystal substrate according to a second embodiment.
Figure 8:
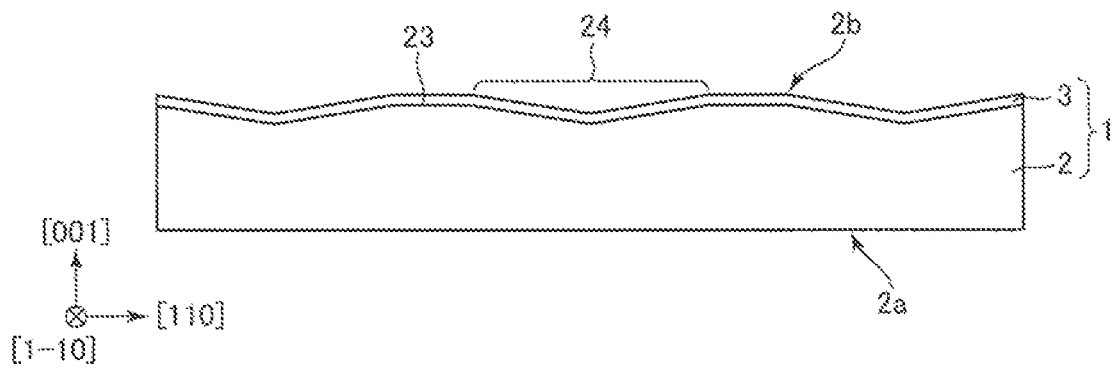
FIG. 8 is a plan view showing a Si(1-10) plane of the single crystal substrate according to the second embodiment.
Figure 9:
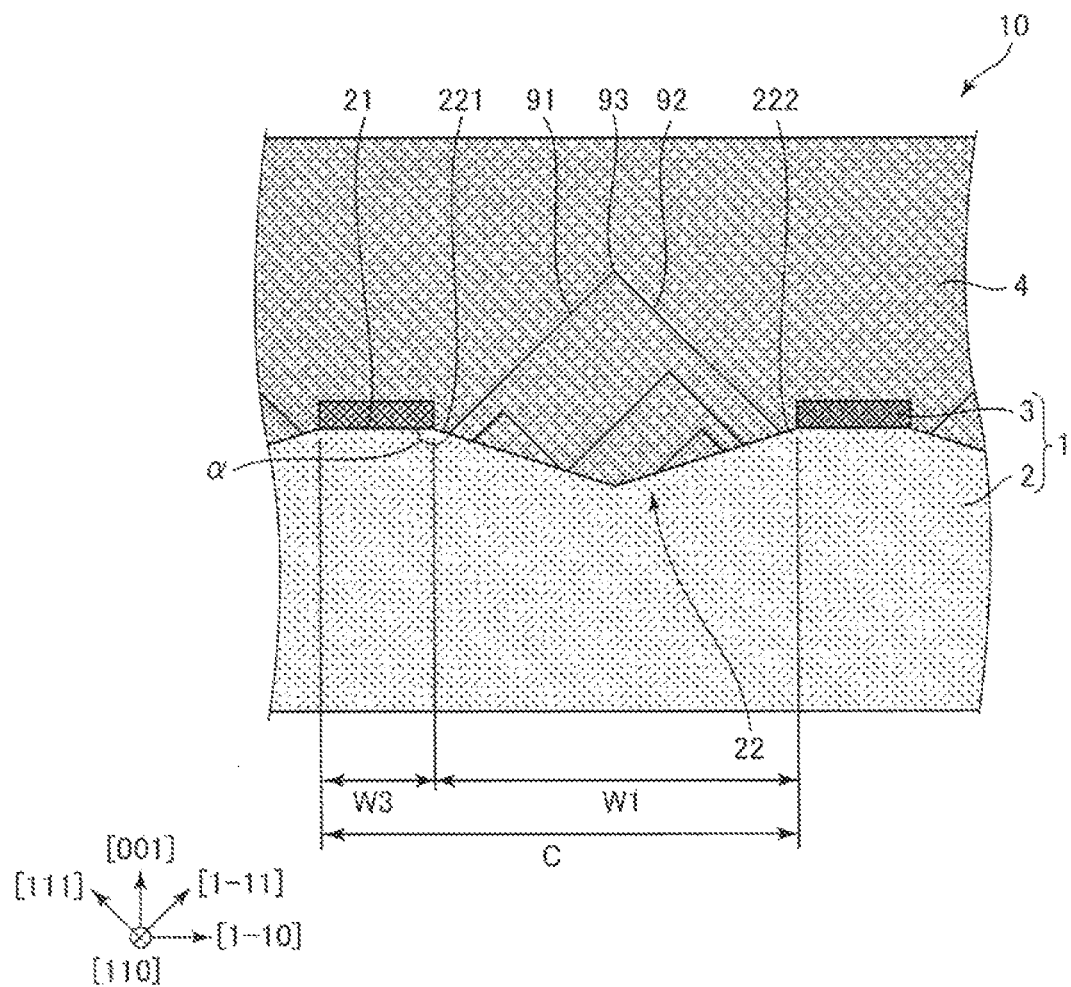
FIG. 9 is a partially enlarged cross-sectional view of a silicon carbide substrate including the single crystal substrate shown in FIG. 7.

FIG. 7 is a plan view showing the Si(110) plane of the single crystal substrate according to the second embodiment. Further, FIG. 8 is a plan view showing the Si(1-10) plane of the single crystal substrate according to the second embodiment. Further, FIG. 9 is a partially enlarged cross-sectional view of a silicon carbide substrate including the single crystal substrate shown in FIG. 7.

Hereinafter, the second embodiment will be described, however, in the following description, different points from the first embodiment will be mainly described, and the description of the same matter will be omitted. Incidentally, the same reference numerals are given to the same components as those in the first embodiment described above.

The single crystal substrate 1 according to this embodiment is the same as the single crystal substrate 1 according to the first embodiment except that the shape of the foundation substrate 2 is different, and a silicon carbide foundation film 3 is further included.

The upper face 2b of the foundation substrate 2 according to this embodiment includes, in addition to the first grooves 22 and the second grooves 24, a Si(001) plane as a first planar face 21 provided between the first grooves 22, and a Si(001) plane as a second planar face 23 provided between the second grooves 24. That is, in the upper face 2b according to this embodiment, the first planar face 21 extending in the [110] direction and the first groove 22 extending in the [110] direction are alternately aligned in a direction orthogonal to the [110] direction. Further, in the upper face 2b, the second planar face 23 extending in the [1-10] direction and the second groove 24 extending in the [1-10] direction are alternately aligned in a direction orthogonal to the [1-10] direction so as to overlap therewith.

Further, the single crystal substrate 1 according to this embodiment further includes the silicon carbide foundation film 3 provided on the first planar face 21. The silicon carbide foundation film 3 functions as a seed layer when the silicon carbide growth layer 4 is epitaxially grown on the single crystal substrate 1. Therefore, by further including the silicon carbide foundation film 3, even when the film thickness of the silicon carbide growth layer 4 to be grown on the single crystal substrate 1 is thin, the silicon carbide growth layer 4 of higher quality is obtained.

Here, the first planar face 21 serves as a region for forming the silicon carbide foundation film 3. That is, by providing the first planar face 21, for example, a seed layer like the silicon carbide foundation film 3 can be stably provided adjacent to the first groove 22. According to this, when the silicon carbide growth layer 4 is grown by using the silicon carbide foundation film 3 as the seed layer, the silicon carbide growth layer 4 can be efficiently and stably grown toward the first groove 22 from the silicon carbide foundation film 3. As a result, the silicon carbide growth layer 4 of higher quality is obtained.

Incidentally, the first planar face 21 may be parallel or non-parallel to the lower face 2a (rear face). When it is parallel, the silicon carbide foundation film 3 having a uniform thickness is easily provided to the first planar face 21, and therefore, also as the silicon carbide growth layer 4 to be grown toward the first groove 22, one with few crystal defects is obtained.

Further, an angle α formed by the first planar face 21 and the first crystal face 221 is preferably larger than an angle formed by the first planar face 21 and the Si(1-11) plane. The Si(1-11) plane is a plane parallel to a crystal defect, and therefore, by setting the angle formed by the first planar face 21 and the first crystal face 221 to an angle larger than the angle formed by the first planar face 21 and the Si(1-11) plane, crystal defects are associated with each other with a higher probability, and can be vanished or reduced.

Further, an angle formed by the first planar face 21 and the second crystal face 222 is also the same as the angle formed by the first planar face 21 and the first crystal face 221.

Further, in each drawing, an example in which the first planar face 21 is the Si(001) plane is illustrated, however, the first planar face 21 is not limited to this plane, and may be a plane formed by inclining the Si(001) plane by a predetermined angle. As one example, a plane formed by inclining the Si(001) plane to the [110] direction by an angle more than 0° and less than 54.7° is exemplified. By using the plane inclined in this manner as the first planar face 21, crystal defects can be vanished or reduced not only in the first groove 22, but also in the first planar face 21. As a result, the silicon carbide growth layer 4 with fewer crystal defects and of high quality can be formed.

Incidentally, the inclination angle from the Si(001) plane is more preferably 1° or more and 15° or less, further more preferably 2° or more and 10° or less. According to this, the above-mentioned effect becomes more prominent, and the quality of the silicon carbide growth layer 4 is further enhanced.

A period C (see FIG. 9) of the first groove 22, that is, the sum of the width W1 of the first groove 22 and a width W3 of the first planar face 21 is not particularly limited, but is preferably 0.1 μm or more and 100 μm or less, more preferably 0.2 μm or more and 20 μm or less. By setting the period C of the first groove 22 within the above range, even when the film thickness of the silicon carbide growth layer 4 to be grown on the single crystal substrate 1 is thin, crystal defects can be more efficiently vanished or reduced.

Further, the width W1 of the first groove 22 is preferably 5% or more and 95% or less, more preferably 30% or more and 85% or less of the period C of the first groove 22. By setting the ratio of the width W1 of the first groove 22 to the period C of the first groove 22 within the above range, the balance between the width W1 of the first groove 22 and the width W3 of the first planar face 21 is optimized. As a result, even when the film thickness of the silicon carbide growth layer 4 to be grown on the single crystal substrate 1 is thin, crystal defects can be more efficiently vanished or reduced.

The silicon carbide foundation film 3 is provided on the first planar face 21 in the upper face 2b of the foundation substrate 2. This silicon carbide foundation film 3 may be, for example, a carbide film formed by modifying a surface of a silicon single crystal substrate, or may be a silicon carbide film obtained by depositing SiC on the upper face 2b of the foundation substrate 2.

A crystal structure of the silicon carbide foundation film 3 is not particularly limited, however, for example, a cubic crystal SiC (3C—SiC) is adopted. Incidentally, it may be a crystal other than 3C—SiC, for example, 4H—SiC or 6H—SiC.

Further, the thickness of the silicon carbide foundation film 3 is not particularly limited, but is preferably 1 nm or more and 100 nm or less, more preferably 2 nm or more and 50 nm or less, further more preferably 3 nm or more and 10 nm or less. By setting the thickness of the silicon carbide foundation film 3 within the above range, it has a necessary and sufficient thickness as the seed layer.

Incidentally, when the thickness of the silicon carbide foundation film 3 is less than the above lower limit, the thickness of the silicon carbide foundation film 3 may be insufficient as the seed layer. On the other hand, when the thickness of the silicon carbide foundation film 3 exceeds the above upper limit, the thickness of the silicon carbide foundation film 3 becomes too thick, and therefore, depending on the conditions for epitaxial growth or the like, the silicon carbide foundation film 3 may affect the silicon carbide growth layer 4.

Further, the thickness of the silicon carbide foundation film 3 is determined by a method, for example, by measuring the thickness by a measurement method using an optical technique such as ellipsometry, or by observing a cross section of the single crystal substrate 1 using an electron microscope, a light microscope, or the like, and measuring the thickness of the silicon carbide foundation film 3 on the observation image, or the like.

The whole of the silicon carbide foundation film 3 is preferably a single crystal, but is not necessarily limited thereto, and may be a polycrystal, a microcrystal, or an amorphous crystal.

Also in the second embodiment as described above, the same effect as that of the first embodiment is obtained.

Third Embodiment of Single Crystal Substrate

Next, the single crystal substrate 1 according to a third embodiment will be described.

Figure 10:
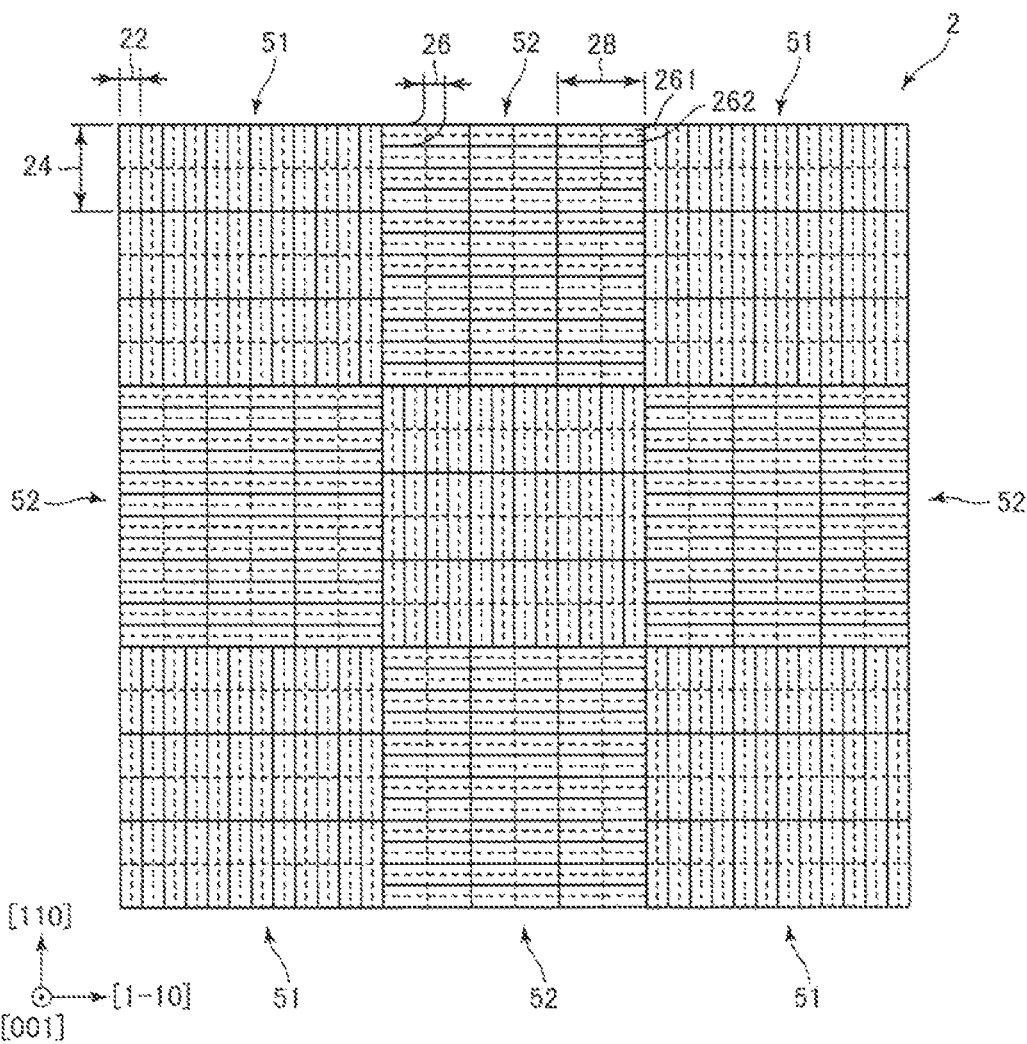
FIG. 10 is a plan view showing an upper face of a single crystal substrate according to a third embodiment.
Figure 11:
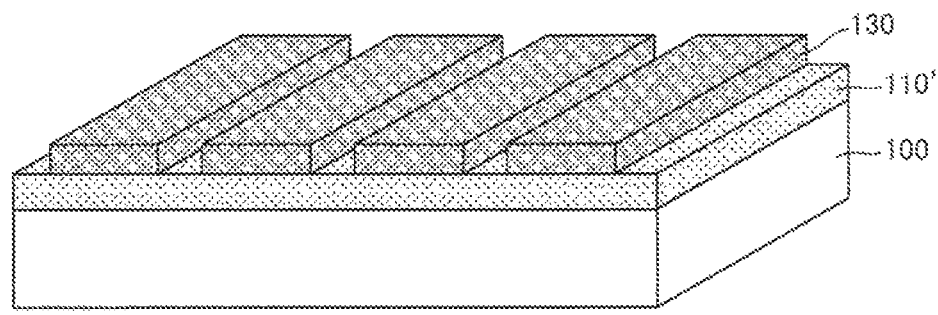
FIG. 11 is a view for illustrating an embodiment of a method for producing a single crystal substrate.
Figure 12:
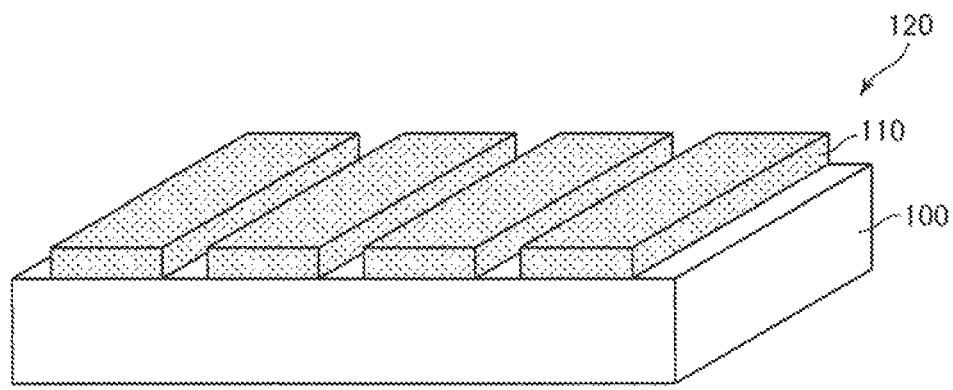
FIG. 12 is a view for illustrating an embodiment of the method for producing a single crystal substrate.

FIG. 10 is a plan view showing an upper face of the single crystal substrate according to the third embodiment.

Hereinafter, the third embodiment will be described, however, in the following description, different points from the first embodiment will be mainly described, and the description of the same matter will be omitted. Incidentally, the same reference numerals are given to the same components as those in the first embodiment described above.

The single crystal substrate 1 according to this embodiment is the same as the single crystal substrate 1 according to the first embodiment except that the shape of the foundation substrate 2 is different.

The upper face 2b of the foundation substrate 2 according to this embodiment is divided into a plurality of regions. In an example shown in FIG. 10, the plurality of regions are occupied by a first region 51 and a second region 52.

Among these, the first region 51 includes a plurality of first grooves 22 and a plurality of second grooves 24 orthogonal thereto in the same manner as in the first embodiment. As described above, each first groove 22 extends in the [110] direction, and is also aligned in a direction orthogonal to the [110] direction. On the other hand, each second groove 24 extends in the [1-10] direction, and is also aligned in a direction orthogonal to the [1-10] direction.

On the other hand, the second region 52 is a region formed by turning the first region 51 by 90° with the [001] direction as the axis. Specifically, the second region 52 includes a plurality of third grooves 26, and a plurality of fourth grooves 28 orthogonal thereto.

Here, each third groove 26 is the same as each first groove 22 except that the extending direction is different. That is, the transverse cross-sectional shape of each third groove 26 is a V shape. Then, each third groove 26 extends in the [1-10] direction, and is also aligned in a direction orthogonal to the [1-10] direction. Further, each third groove 26 includes a third crystal face 261 and a fourth crystal face 262 opposed to the third crystal face 261 in an inner face thereof. Then, each third groove 26 extends in the [1-10] direction while maintaining the transverse cross-sectional shape of the V shape constituted by such a third crystal face 261 and a fourth crystal face 262. Incidentally, the state where the third crystal face 261 and the fourth crystal face 262 are opposed to each other refers to a state where both are located in an inner face of the third groove 26, and also are located opposite to each other across a bottom of the third groove 26.

Further, each fourth groove 28 is the same as each second groove 24 except that the extending direction is different. That is, the transverse cross-sectional shape of each fourth groove 28 is a V shape. Then, each fourth groove 28 extends in the [110] direction, and is also aligned in a direction orthogonal to the [110] direction. That is, by displacing a ridge line of the third groove 26 in a thickness direction of the foundation substrate 2, a polygonal line is formed, and by extending this polygonal line in the [110] direction, each fourth groove 28 is formed. According to this, the second region 52 is covered with the plurality of fourth grooves 28 arranged in parallel to one another so as to overlap with the third grooves 26 in plan view.

That is, the foundation substrate 2 has the first region 51 including the first grooves 22 and the second grooves 24, and the second region 52 including the plurality of third grooves 26, which include the third crystal face 261 and the fourth crystal face 262 opposed to the third crystal face 261 in an inner face thereof, and the extending direction of which is different (in this embodiment, different by 90°) from that of the first groove 22, and the plurality of fourth grooves 28, the extending direction of which intersects with the third grooves 26, and in which the third grooves 26 are formed in a displaced manner in a depth direction.

Such a first region 51 and a second region 52 are alternately arranged in the [1-10] direction. Further, the first region 51 and the second region 52 are also alternately arranged in the [110] direction. As a result, the first region 51 and the second region 52 are adjacent to each other and are also alternately arranged (checkered pattern).

By providing such a first region 51 and a second region 52, the isotropy of the silicon carbide growth layer 4 to be grown on the single crystal substrate 1 can be enhanced. That is, by alternately arranging the first region 51 and the second region 52, the shape of the single crystal substrate 1 as a whole becomes isotropic. Due to this, crystal defects occurring in the silicon carbide growth layer 4 grown thereon are also isotropically generated, and therefore, the generation of crystal defects remarkably progressing toward one direction can be suppressed. As a result, even when the film thickness of the silicon carbide growth layer 4 to be grown on the single crystal substrate 1 is thin, the silicon carbide growth layer 4 of high quality can be formed.

Further, also the characteristics of the silicon carbide growth layer 4 become isotropic, and therefore, a semiconductor element having uniform characteristics can be formed even without taking into account the orientation of an element to be formed in the silicon carbide growth layer 4 or the like.

The shape of the first region 51 and the second region 52 is not particularly limited, and may be a quadrangle such as a rectangle, a hexagon, an octagon, or the like, but is particularly preferably a square. According to this, the shape of the first region 51 and the second region 52 becomes isotropic, and therefore, the above-mentioned effect becomes more prominent.

Further, a possible maximum length of each of the first region 51 and the second region 52 is appropriately set according to the size of the single crystal substrate 1, the width of the groove, or the like, but is preferably 3 mm or more and 5 cm or less, more preferably 5 mm or more and 3 cm or less as an example. According to this, the single crystal substrate 1 capable of forming the silicon carbide growth layer with higher isotropy while preventing the degree of production difficulty from becoming too high is obtained.

Also in the third embodiment as described above, the same effect as that of the first embodiment is obtained.

Incidentally, the extending direction of the third groove 26 according to this embodiment is different by 90° from that of the first groove 22, however, this angle is not particularly limited as long as it exceeds 0°, and is preferably from about 80 to 100°.

Method for Producing Single Crystal Substrate

Next, one example of a method for producing the single crystal substrate 1 shown in FIGS. 7 and 8 will be described.

FIGS. 11 to 17 are each a view for illustrating an embodiment of a method for producing a single crystal substrate.

1. First, a single crystal base material 100 is prepared. The single crystal base material 100 becomes a raw material of the foundation substrate 2, and therefore, for example, the same single crystal material as that of the foundation substrate 2 described above is exemplified.

Subsequently, a masking coating film 110' is provided on the surface of the single crystal base material 100. Here, first, the masking coating film 110' is formed so as to cover the entire surface of the single crystal base material 100 (see FIG. 11). The masking coating film 110' is constituted by a material having resistance to the below-mentioned etching treatment of the single crystal base material 100. Examples of such a material include silicon oxide and silicon nitride.

Subsequently, a coating film having photosensitivity is formed on a surface of the masking coating film 110'. Then, this photosensitive coating film is patterned by performing an exposure/development treatment. By doing this, a resist film 130 provided only in a target region is obtained (see FIG. 11).

Subsequently, the masking coating film 110' is subjected to an etching treatment through the patterned resist film 130. By doing this, a region that is not covered with the resist film 130 in the masking coating film 110' is etched. As a result, a first mask 110 provided in a region corresponding to the second groove 24 to be formed in the below-mentioned step is obtained (see FIG. 12). Then, a base material with a mask 120 including the single crystal base material 100 and the first mask 110 provided in a portion of the surface thereof is obtained.

Thereafter, the resist film 130 is removed.

Figure 13:
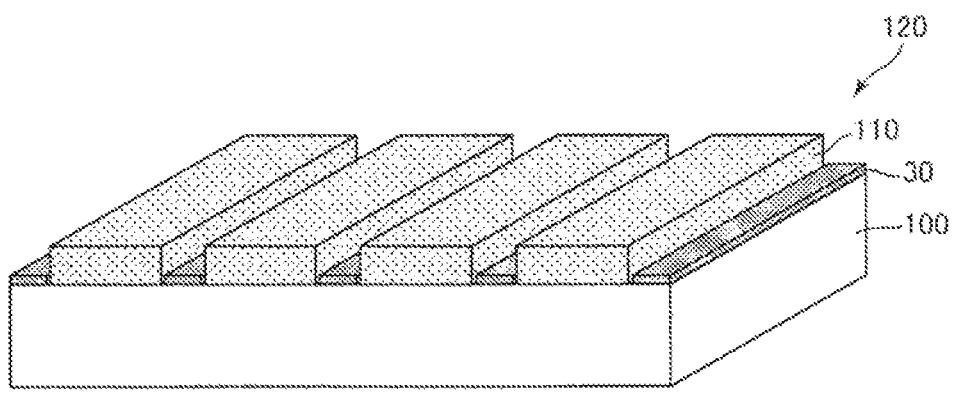
FIG. 13 is a view for illustrating an embodiment of the method for producing a single crystal substrate.

2. Subsequently, as shown in FIG. 13, a second mask 30 is formed on the surface of the single crystal base material 100. This second mask 30 is formed in a region that is not covered with the first mask 110 in the surface of the single crystal base material 100. Incidentally, the second mask 30 may be formed on the surface of the first mask 110, but is omitted in FIG. 13.

A method for forming the second mask 30 is not particularly limited, but examples thereof include a method for forming it by modification (a carbonization treatment) of the surface of the single crystal base material 100, a method for forming it by depositing silicon carbide on the upper face of the single crystal base material 100.

The carbonization treatment is performed by heating the single crystal base material 100 in a carbon-based gas atmosphere. According to the carbonization treatment, apart of the single crystal base material 100 is converted into silicon carbide, and therefore, as compared with other methods, the second mask 30 having high crystallinity can be formed.

The carbon-based gas atmosphere is constituted by a treatment gas containing a carbon-based gas. The carbon-based gas is not limited as long as it is a gas containing carbon, however, examples thereof include hydrocarbon-based gasses such as acetylene ($C_2H_2$), propane ($C_3H_8$), methane ($CH_4$), ethane ($C_2H_6$), n-butane (n-$C_4H_{10}$), isobutane (i-$C_4H_{10}$), and neopentane (neo-$C_5H_{12}$) in addition to ethylene ($C_2H_4$), and among these, one type or two or more types in combination can be used.

Further, it may be a mixed gas of any of these hydrocarbon-based gasses with another gas. Examples of such another gas include a hydrogen silicide-based gas, a silicon chloride-based gas, and a silicon carbide-based gas.

Further, in these treatment gasses, an arbitrary gas such as a carrier gas may be mixed. Examples of the carrier gas include hydrogen, nitrogen, helium, and argon. When the carrier gas is used, the concentration of the carbon-based gas in the treatment gas is appropriately set according to the rate of the carbonization treatment or the like, but is preferably 0.1 vol % or more and 30 vol % or less, more preferably 0.3 vol % or more and 5 vol % or less as an example.

A heating temperature of the single crystal base material 100 in the carbonization treatment is preferably 500° C. or higher and 1400° C. or lower, more preferably 800° C. or higher and 1300° C. or lower, further more preferably 950°

C. or higher and 1200° C. or lower. Further, as for a heating time of the single crystal base material 100 in the carbonization treatment, an exposure time to the heating temperature is preferably 0.5 minutes or more, more preferably 1 minute or more and 120 minutes or less, further more preferably 3 minutes or more and 90 minutes or less.

By setting the heating conditions within the above ranges, the second mask 30 having a thickness as described above can be formed. Further, by optimizing a thermal energy to be added, a conversion rate to silicon carbide is optimized, and therefore, the second mask 30 of good quality can be formed.

Further, the carbonization treatment may be performed in any of a normal pressure atmosphere, a pressurized atmosphere, and a reduced pressure atmosphere, but may preferably be performed in a state where the treatment gas is introduced while discharging the gas in a treatment chamber in which the single crystal base material 100 is placed. As one example, an introduction amount of the carbon-based gas in the treatment gas is set to 10 sccm or more and 100 sccm or less.

On the other hand, in a silicon carbide deposition treatment, for example, a gas phase deposition method such as a CVD method or a vapor deposition method is used.

3. Subsequently, the single crystal base material 100 is subjected to an etching treatment. By doing this, the second groove 24 is formed (see FIG. 14).

In this etching treatment, etching is performed so as to remove a region below the first mask 110 (a region facing the first mask 110) in the upper face of the single crystal base material 100.

Figure 14:
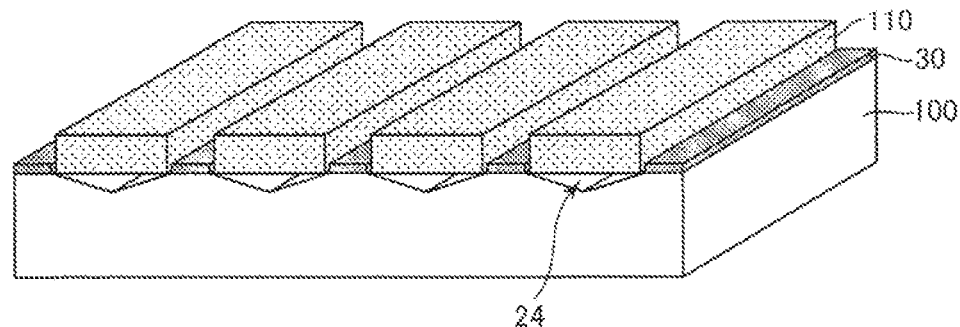
FIG. 14 is a view for illustrating an embodiment of the method for producing a single crystal substrate.
Figure 15:
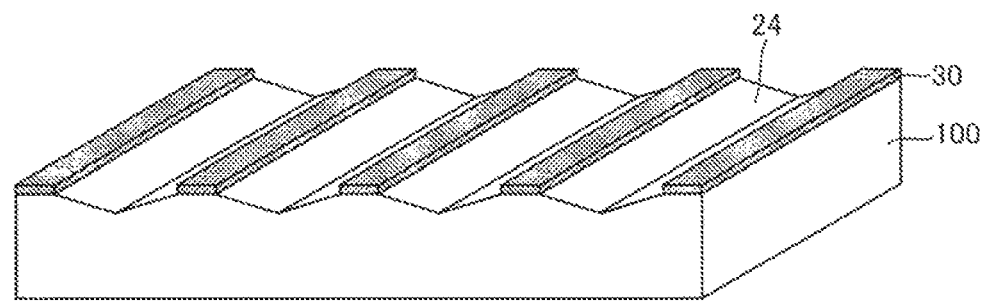
FIG. 15 is a view for illustrating an embodiment of the method for producing a single crystal substrate.

As such an etching treatment, for example, a treatment in which the base material with a mask 120 provided with the second mask 30 is heated to a temperature not lower than the sublimation temperature of Si is exemplified. By doing this, Si atoms contained in the single crystal base material 100 easily sublime and are discharged to the outside from a gap between the single crystal base material 100 and the first mask 110. As a result, the region below the first mask 110 is etched, and the second groove 24 as shown in FIG. 14 is formed.

Incidentally, the heating temperature slightly varies depending on a pressure or the like in a space where the single crystal base material 100 is placed, but is set to a temperature, at which Si atoms can sublime, and which is not higher than the melting point of Si, and may be within a range of 900° C. or higher and 1400° C. or lower. Further, the heating time is set on a timely basis according to the heating temperature, however, the exposure time to the heating temperature is preferably 0.5 minutes or more and 60 minutes or less.

Further, the heating of the base material with a mask 120 may be performed in a normal pressure atmosphere or a pressurized atmosphere, but is preferably performed in a reduced pressure atmosphere or a reducing atmosphere. According to this, sublimation of Si atoms is accelerated or oxidation is prevented, and therefore, the etching treatment can be performed while suppressing denaturation of the single crystal base material 100.

A pressure of this reduced pressure atmosphere is not particularly limited as long as it is less than the atmospheric pressure, but is set to, for example, 0.5 Pa or less.

In such a manner, the second groove 24 is formed below the first mask 110.

Incidentally, etching is suppressed in a region where the second mask 30 is formed in the upper face of the single crystal base material 100. Therefore, in this region, the above-mentioned second planar face 23 is formed.

Further, in the etching treatment, in place of the above-mentioned heating treatment, a treatment in which the base material with a mask 120 provided with the second mask 30 is exposed to an etching gas may be used.

4. Subsequently, the first mask 110 is removed (see FIG. 15).

In the removal of the first mask 110, for example, an etching treatment is used.

5. Subsequently, the second mask 30 is removed.

In the removal of the second mask 30, for example, an etching treatment, a mechanical polishing treatment, or the like is used.

Figure 16:
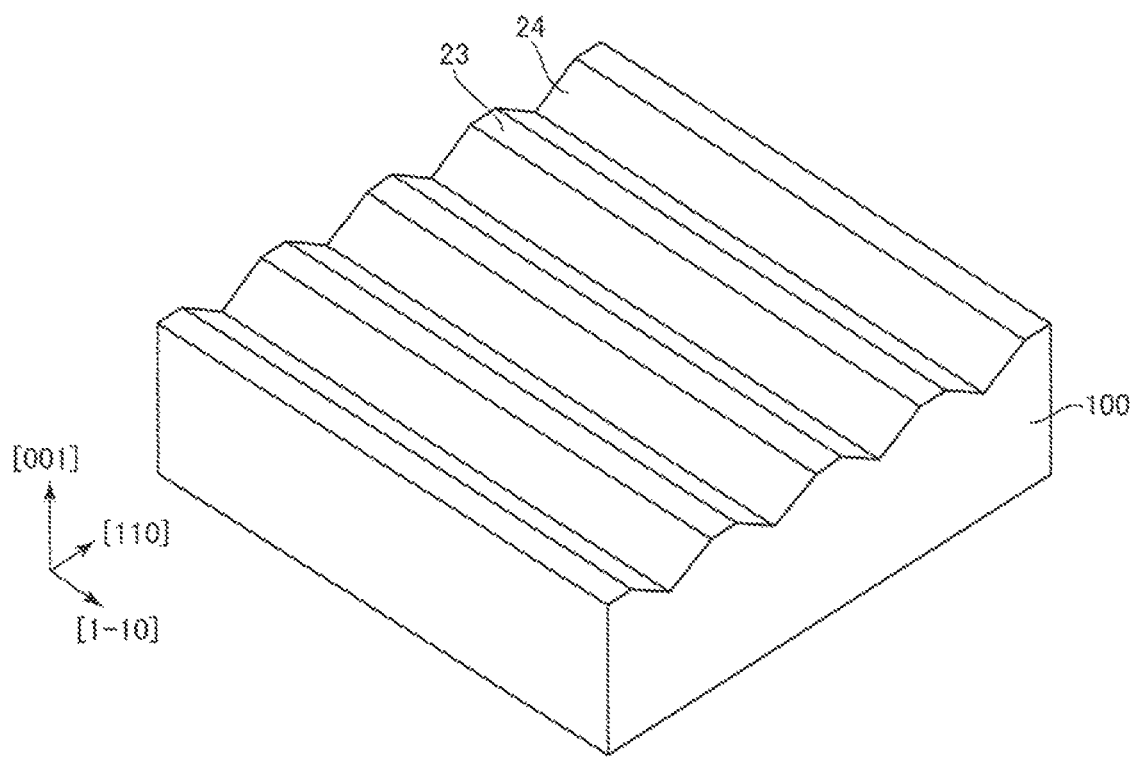
FIG. 16 is a view for illustrating an embodiment of the method for producing a single crystal substrate.
Figure 17:
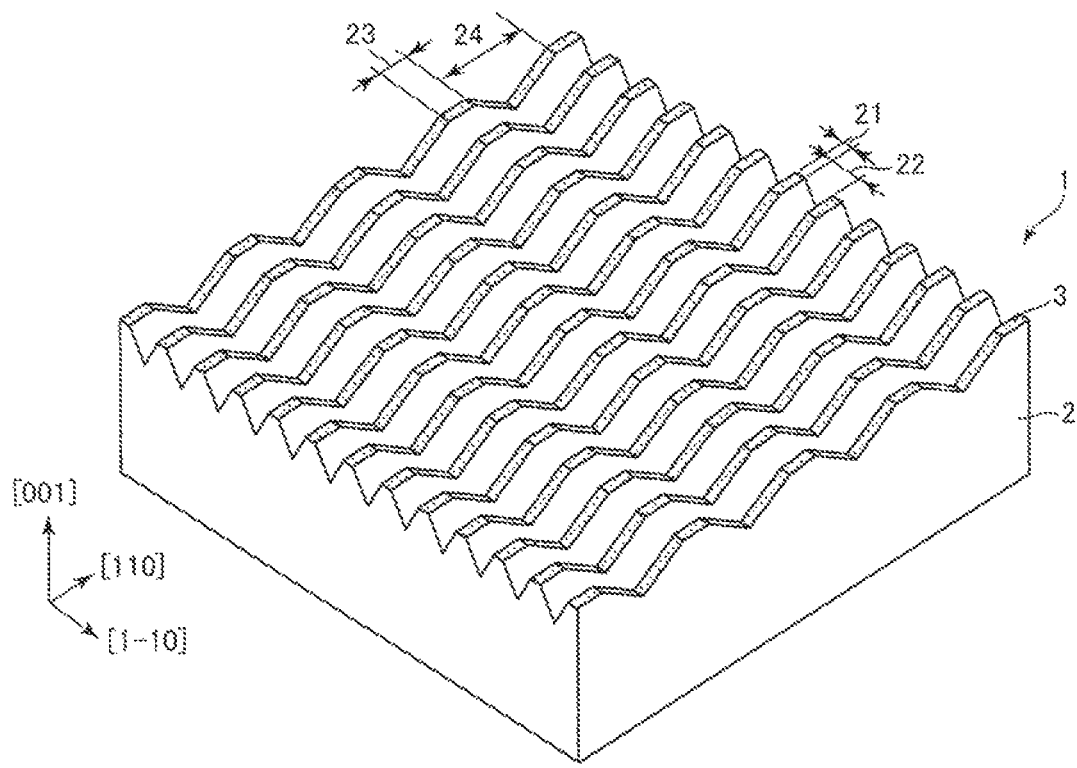
FIG. 17 is a view for illustrating an embodiment of the method for producing a single crystal substrate.

In such a manner, the second groove 24 and the second planar face 23 are formed (see FIG. 16).

6. Subsequently, the single crystal base material 100 having the second groove 24 and the second planar face 23 formed thereon is subjected to the same process as the steps [1] to [4]. By doing this, the first groove 22 and the first planar face 21 are formed (see FIG. 17).

In such a manner, the single crystal substrate 1 is obtained. Incidentally, the same mask as the second mask 30 is left in the end, and this becomes the silicon carbide foundation film 3. Therefore, the single crystal substrate 1 including the foundation substrate 2 and the silicon carbide foundation film 3 is obtained.

Method for Producing Silicon Carbide Substrate

Next, one example of a method for producing the silicon carbide substrate 10 shown in FIG. 1 will be described.

The silicon carbide substrate 10 is produced by epitaxially growing the silicon carbide growth layer 4 on the single crystal substrate 1.

The silicon carbide growth layer 4 grows by, for example, housing the single crystal substrate 1 in a treatment chamber, and heating the single crystal substrate 1 while introducing a raw material gas. As a result, the silicon carbide substrate 10 shown in FIG. 1 is obtained.

Examples of the raw material gas include a mixed gas obtained by mixing a gas containing carbon and a gas containing silicon at a predetermined ratio, a carbon and silicon containing gas containing carbon and silicon at a predetermined ratio, and a mixed gas of a plurality of types obtained by mixing a gas containing carbon, a gas containing silicon, and a gas containing carbon and silicon at a predetermined ratio.

Examples of the gas containing carbon among these include acetylene ($C_2H_2$), propane ($C_3H_8$), methane ($CH_4$), ethane ($C_2H_6$), n-butane (n-$C_4H_{10}$), isobutane (i-$C_4H_{10}$), and neopentane (neo-$C_5H_{12}$) in addition to ethylene ($C_2H_4$), and among these, one type or two or more types in combination can be used.

Further, examples of the gas containing silicon include monosilane ($SiH_4$), disilane ($Si_2H_6$), trisilane ($Si_3H_8$), tetrasilane ($Si_4H_{10}$), dichlorosilane ($SiH_2Cl_2$), tetrachlorosilane ($SiCl_4$), trichlorosilane ($SiHCl_3$), and hexachlorodisilane ($Si_2Cl_6$), and among these, one type or two or more types in combination can be used.

Further, examples of the gas containing carbon and silicon include methylsilane ($SiH_3CH_3$), dimethylsilane ($SiH_2(CH_3)_2$), and trimethylsilane ($SiH(CH_3)_3$), and among these, one type or two or more types in combination can be used.

Further, a heating temperature in the epitaxial growth, that is, a temperature of the single crystal substrate 1 during the epitaxial growth is preferably 600° C. or higher and 1400° C. or lower, more preferably 800° C. or higher and 1350° C. or lower, further more preferably 950° C. or higher and 1100° C. or lower. Further, a heating time in the epitaxial growth is appropriately set according to the intended thickness of the silicon carbide growth layer 4.

Further, a pressure in the treatment chamber in the epitaxial growth is not particularly limited, but is preferably $1\times10^{-4}$ Pa or more and the atmospheric pressure (100 kPa) or less, more preferably $1\times10^{-3}$ Pa or more and 10 kPa or less.

In such a manner, the silicon carbide substrate 10 having the silicon carbide growth layer 4 of high quality can be efficiently obtained.

Such a silicon carbide substrate 10 of high quality is favorably used, for example, as a semiconductor substrate capable of producing a high-performance power device.

Hereinabove, the single crystal substrate and the silicon carbide substrate according to the invention are described based on the embodiments illustrated in the drawings, however, the invention is not limited thereto. For example, each of the single crystal substrate and the silicon carbide substrate according to the invention may be one in which an arbitrary component is added to the above-mentioned embodiments. In addition, the method for producing a single crystal substrate described above may be one in which an arbitrary step is added.

EXAMPLES

Next, specific Examples will be described.

1. Production of Silicon Carbide Substrate

Example 1

1. First, as a single crystal base material, a 6-inch (diameter: 150 mm, thickness: 0.625 mm) silicon wafer having a Si(001) plane as a principal plane was prepared. Then, the surface was washed with hydrofluoric acid or the like.

2. Subsequently, a masking coating film was formed on the entire face of the silicon wafer. Subsequently, a resist film was formed on the masking coating film, and thereafter, the masking coating film was etched. By doing this, a base material with a mask having a first mask patterned into a desired shape was obtained.

2. Subsequently, a second mask was formed on a surface of the base material with a mask. Incidentally, in the formation of the second mask, a treatment of carbonizing the surface of the silicon wafer was performed by heating at 1000° C. for 60 minutes using ethylene gas.

3. Subsequently, the base material with a mask provided with the second mask was subjected to an etching treatment. By doing this, second grooves and second planar faces extending in a [1-10] direction were formed. In this etching treatment, the base material with a mask was subjected to a heating treatment at 1000° C. for 30 minutes in a reduced pressure atmosphere.

4. Subsequently, the first mask was removed by an etching treatment.

5. Subsequently, the second mask was removed by a polishing treatment.

6. Subsequently, first grooves and first planar faces were formed in the same manner as the steps<1> to <4>.

7. Subsequently, a silicon carbide growth layer was epitaxially grown on the obtained single crystal substrate. By doing this, a silicon carbide substrate was obtained. Incidentally, in the epitaxial growth, the silicon carbide growth layer was obtained by heating at 1000° C. for 2 hours using ethylene gas and dichlorosilane gas as the raw material gas.

Examples 2 to 12

Silicon carbide substrates were obtained in the same manner as in Example 1 except that the production conditions for the single crystal substrate were changed as shown in Table 1 or Table 2.

Examples 13 to 17

The production conditions for the single crystal substrate were changed as shown in Table 2. Specifically, the production conditions were changed so as to include a first region and a second region including third grooves and fourth grooves obtained by turning the first grooves and the second grooves formed in the first region by 90°, respectively, as in the above-mentioned third embodiment.

Comparative Example 1

A silicon carbide substrate was obtained in the same manner as in Example 1 except that the production conditions for the single crystal substrate were changed as shown in Table 1 and also the transverse cross-sectional shape of the second groove was changed to a U shape.

Comparative Example 2

A silicon carbide substrate was obtained in the same manner as in Comparative Example 1 except that the second grooves were omitted.

Note that in Tables 1 and 2, the "V shape" indicates that the transverse cross-sectional shape of the groove is a V shape (the straight lines are open at an opening angle less than 180°), and the "U shape" indicates that the transverse cross-sectional shape of the groove is a U shape (the groove is formed by a curved line).

2. Evaluation of Silicon Carbide Substrate 2.1 Density of Crystal Defects

With respect to the silicon carbide substrates obtained in the respective Examples and the respective Comparative Examples, the density of crystal defects was measured. Note that the density of crystal defects was measured by observing the surface of a central portion of the silicon carbide substrate with an atomic force microscope (AFM).

Subsequently, relative values of the densities of crystal defects in the silicon carbide substrates obtained in the respective Examples and the respective Comparative Examples were calculated when the density of crystal defects in the silicon carbide substrate obtained in Comparative Example 2 was assumed to be 1. Then, the calculated results were evaluated in accordance with the following evaluation criteria.

Evaluation Criteria for Density of Crystal Defects

A: The relative value of the density of crystal defects is less than 0.5.

B: The relative value of the density of crystal defects is 0.5 or more and less than 0.75.

C: The relative value of the density of crystal defects is 0.75 or more and less than 1.

D: The relative value of the density of crystal defects is 1 or more.

The evaluation results are shown in Tables 1 and 2.

2.2 Distribution of Crystal Defects

With respect to the silicon carbide substrates obtained in the respective Examples and the respective Comparative Examples, the distribution of crystal defects was evaluated. Note that the distribution of crystal defects was evaluated by observing the surface of each of a central portion and a peripheral portion of the silicon carbide substrate with an atomic force microscope.

Specifically, first, the density of crystal defects was measured in a central portion and a peripheral portion. Subsequently, a difference therebetween was calculated. Then, relative values of the differences in crystal defects in the silicon carbide substrates obtained in the respective Examples and the respective Comparative Examples were calculated when the difference in crystal defects in the silicon carbide substrate obtained in Comparative Example 2 was assumed to be 1. Then, the calculated results were evaluated in accordance with the following evaluation criteria.

Evaluation Criteria for Distribution of Crystal Defects

A: The relative value of the difference in crystal defects is less than 0.5.

B: The relative value of the difference in crystal defects is 0.5 or more and less than 0.75.

C: The relative value of the difference in crystal defects is 0.75 or more and less than 1.

D: The relative value of the difference in crystal defects is 1 or more.

The evaluation results are shown in Tables 1 and 2.

TABLE 1

| | | | | Ex. 1 | Ex. 2 | Ex. 3 | Ex. 4 | Ex. 5 | Ex. 6 | Ex. 7 |
|---|---|---|---|---|---|---|---|---|---|---|
| Production conditions for single substrate | First groove | Width of groove | μm | 6 | 8 | 9 | 9 | 9 | 9 | 9 |
| | | Width of planar face | μm | 2 | 2 | 2 | 0.5 | 10 | 25 | 2 |
| | | Inclination angle of planar face | ° | 0 | 0 | 0 | 0 | 0 | 0 | 4 |
| | | Period of groove | μm | 8 | 10 | 11 | 9.5 | 19 | 34 | 11 |
| | | Ratio of groove | % | 75 | 80 | 82 | 95 | 47 | 26 | 82 |
| | | Opening angle of groove | ° | 120 | 150 | 168 | 168 | 168 | 168 | 168 |
| | | Shape of groove | — | V shape | V shape | V shape | V shape | V shape | V shape | V shape |
| | Second groove | Width of groove | μm | 500 | 1000 | 2000 | 3000 | 5000 | 8000 | 10000 |
| | | Width of planar face | μm | 100 | 200 | 500 | 300 | 2000 | 3000 | 500 |
| | | Inclination angle of planar face | ° | 0 | 0 | 0 | 0 | 0 | 0 | 4 |
| | | Period of groove | μm | 600 | 1200 | 2500 | 3300 | 7000 | 11000 | 10500 |
| | | Ratio of groove | % | 83 | 83 | 80 | 91 | 71 | 73 | 95 |
| | | Opening angle of groove | ° | 172 | 172 | 172 | 172 | 172 | 172 | 172 |
| | | Shape of groove | — | V shape | V shape | V shape | V shape | V shape | V shape | V shape |
| | Multiple of width of second groove to width of first groove | | times | 83 | 125 | 222 | 333 | 556 | 889 | 1111 |
| | Thickness of silicon carbide foundation film | | nm | 70 | 50 | 50 | 50 | 50 | 50 | 50 |
| Production condition for silicon carbide substrate | Thickness of silicon carbide growth layer | | μm | 0.5 | 0.3 | 0.1 | 0.3 | 0.3 | 0.3 | 0.3 |
| Evaluation results of silicon carbide substrate | Density of crystal defects | | — | B | B | A | B | A | B | A |
| | Distribution of crystal defects | | — | B | B | B | B | B | B | B |

| | | | | Ex. 8 | Ex. 9 | Ex. 10 | Ex. 11 | Comp. Ex. 1 | Comp. Ex. 2 |
|---|---|---|---|---|---|---|---|---|---|
| Production conditions for single substrate | First groove | Width of groove | μm | 9 | 9 | 10 | 11 | 9 | 9 |
| | | Width of planar face | μm | 0 | 0 | 2 | 2 | 2 | 2 |
| | | Inclination angle of planar face | ° | 0 | 0 | 0 | 0 | 0 | 0 |
| | | Period of groove | μm | 9 | 9 | 12 | 13 | 11 | 11 |
| | | Ratio of groove | % | 100 | 100 | 83 | 85 | 82 | 82 |
| | | Opening angle of groove | ° | 168 | 168 | 172 | 175 | 168 | 168 |
| | | Shape of groove | — | V shape | V shape | V shape | V shape | V shape | V shape |
| | Second groove | Width of groove | μm | 3000 | 3000 | 5000 | 5000 | 3000 | |
| | | Width of planar face | μm | 0 | 0 | 1000 | 1000 | — | |
| | | Inclination angle of planar face | ° | 0 | 0 | 0 | 0 | — | |
| | | Period of groove | μm | 3000 | 3000 | 6000 | 6000 | — | |
| | | Ratio of groove | % | 100 | 100 | 83 | 83 | 100 | |
| | | Opening angle of groove | ° | 172 | 172 | 172 | 175 | — | |
| | | Shape of groove | — | V shape | V shape | V shape | V shape | U shape | |
| | Multiple of width of second groove to width of first groove | | times | 333 | 333 | 500 | 455 | 333 | |
| | Thickness of silicon carbide foundation film | | nm | 20 | 20 | 30 | 50 | 50 | 50 |
| Production condition for silicon | Thickness of silicon carbide growth layer | | μm | 0.1 | 0.3 | 0.3 | 0.5 | 0.3 | 0.5 |

TABLE 1-continued

Table 1

| | | | | | | | | |
|---|---|---|---|---|---|---|---|---|
| carbide substrate Evaluation results of silicon carbide substrate | Density of crystal defects | — | C | C | A | B | C | D |
| | Distribution of crystal defects | — | B | B | B | B | C | D |

TABLE 2

| | | | | Ex. 12 | Ex. 13 | Ex. 14 | Ex. 15 | Ex.16 | Ex. 17 |
|---|---|---|---|---|---|---|---|---|---|
| Production conditions for single crystal substrate | First groove | Width of groove | μm | 10 | 10 | 10 | 10 | 10 | 10 |
| | | Width of planar face | μm | 2 | 2 | 2 | 2 | 2 | 2 |
| | | Inclination angle of planar face | ° | 0 | 0 | 0 | 0 | 0 | 0 |
| | | Period of groove | μm | 12 | 12 | 12 | 12 | 12 | 12 |
| | | Ratio of groove | % | 83 | 83 | 83 | 83 | 83 | 83 |
| | | Opening angle of groove | ° | 168 | 168 | 168 | 168 | 168 | 168 |
| | | Shape of groove | — | V shape | V shape | V shape | V shape | V shape | V shape |
| | Second groove | Width of groove | μm | 2000 | 2000 | 2000 | 2000 | 2000 | 2000 |
| | | Width of planar face | μm | 300 | 300 | 300 | 300 | 300 | 300 |
| | | Inclination angle of planar face | ° | 0 | 0 | 0 | 0 | 0 | 0 |
| | | Period of groove | μm | 2300 | 2300 | 2300 | 2300 | 2300 | 2300 |
| | | Ratio of groove | % | 87 | 87 | 87 | 87 | 87 | 87 |
| | | Opening angle of groove | ° | 172 | 172 | 172 | 172 | 172 | 172 |
| | | Shape of groove | — | V shape | V shape | V shape | V shape | V shape | V shape |
| | | Multiple of width of second groove to width of first groove | times | 200 | 200 | 200 | 200 | 200 | 200 |
| | | Shape of first region and second region | — | — | square | square | square | square | square |
| | | Length of one side of first region and second region | mm | — | 0.5 | 5 | 10 | 20 | 50 |
| | | Thickness of silicon carbide foundation film | nm | 20 | 20 | 20 | 20 | 20 | 20 |
| Production condition for silicon carbide substrate | | Thickness of silicon carbide growth layer | μm | 0.3 | 0.3 | 0.3 | 0.3 | 0.3 | 0.3 |
| Evaluation results of silicon carbide substrate | | Density of crystal defects | — | A | A | A | A | A | A |
| | | Distribution of crystal defects | — | B | B | A | A | A | B |

As apparent from Table 1, it was confirmed that the silicon carbide substrates obtained in the respective Examples have a relatively low density of crystal defects. From these results, it was confirmed that a single crystal substrate capable of producing a silicon carbide growth layer of high quality is obtained.

In addition, as apparent from Table 2, it was confirmed that by providing the first region and the second region in which the extending directions of the grooves are made different from each other, the difference in crystal defects between the central portion and the peripheral portion is suppressed.

The invention claimed is:

1. A single crystal substrate, characterized in that the single crystal substrate comprises a foundation substrate provided with a plurality of first grooves, which include a first crystal face and a second crystal face opposed to the first crystal face in an inner face thereof, and the extending direction of which is a <110> direction, and a plurality of second grooves, the extending direction of which intersects with the first grooves, and in which the first grooves are formed in a displaced manner in a depth direction, and
a transverse cross-sectional shape of the second groove is a shape in which straight lines are open at an opening angle less than 180°.

2. The single crystal substrate according to claim 1, wherein the foundation substrate has
a first region including the first grooves and the second grooves, and
a second region including a plurality of third grooves, which include a third crystal face and a fourth crystal face opposed to the third crystal face in an inner face thereof, and the extending direction of which is different from that of the first grooves, and a plurality of fourth grooves, the extending direction of which intersects with the third grooves, and in which the third grooves are formed in a displaced manner in a depth direction.

3. The single crystal substrate according to claim 2, wherein the first region and the second region each have a square shape.

4. The single crystal substrate according to claim 2, wherein the first region and the second region are included so that the first region and the second region are adjacent to each other and are alternately arranged.

5. The single crystal substrate according to claim 4, wherein the first region and the second region each have a square shape.

6. The single crystal substrate according to claim 1, wherein an angle formed by the first crystal face and the second crystal face is more than 70.6°.

7. The single crystal substrate according to claim 6, wherein the angle formed by the first crystal face and the second crystal face is 100° or more and 176° or less.

8. The single crystal substrate according to claim 1, wherein the foundation substrate further includes a Si{100} plane as a first planar face provided between the first grooves.

9. The single crystal substrate according to claim 8, further comprising a silicon carbide foundation film provided on the first planar face.

10. The single crystal substrate according to claim 1, wherein the foundation substrate contains silicon, polycrystalline silicon carbide, or diamond.

11. A silicon carbide substrate, characterized by comprising:
the single crystal substrate according to claim 1; and
a silicon carbide growth layer formed on the single crystal substrate.

* * * * *